United States Patent
Thomas et al.

(10) Patent No.: US 7,250,330 B2
(45) Date of Patent: Jul. 31, 2007

(54) METHOD OF MAKING AN ELECTRONIC PACKAGE

(75) Inventors: David L. Thomas, Endicott, NY (US); Charles G. Woychik, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/282,975

(22) Filed: Oct. 29, 2002

(65) Prior Publication Data

US 2004/0082108 A1    Apr. 29, 2004

(51) Int. Cl.
  H01L 21/00    (2006.01)
  H01L 21/30    (2006.01)
(52) U.S. Cl. .................. 438/127; 438/459; 438/615
(58) Field of Classification Search .................. None
See application file for complete search history.

(56) References Cited

U.S. PATENT DOCUMENTS

| | | | |
|---|---|---|---|
| 3,616,401 A * | 10/1971 | Cunningham et al. . | 204/192.25 |
| 3,634,787 A * | 1/1972 | Newell .................. | 333/186 |
| 3,667,005 A * | 5/1972 | Cunningham et al. ...... | 257/757 |
| 3,734,787 A * | 5/1973 | Dhaka et al. ............ | 438/395 |
| 3,787,720 A * | 1/1974 | Kiewit .................. | 257/217 |
| 3,798,512 A * | 3/1974 | Critchlow et al. ........ | 257/400 |
| 3,844,924 A * | 10/1974 | Cunningham et al. . | 204/298.26 |
| 3,924,320 A * | 12/1975 | Altman et al. ........... | 438/570 |
| 3,965,784 A | 6/1976 | Marconi ................. | 83/157 |
| 3,969,750 A * | 7/1976 | Dhaka et al. ............ | 257/599 |
| 4,085,639 A | 4/1978 | Marconi ................. | 83/157 |
| 4,237,601 A * | 12/1980 | Woolhouse et al. ........ | 438/33 |
| 4,446,086 A | 5/1984 | Molenaar et al. ......... | 264/118 |
| 4,589,547 A * | 5/1986 | Stewart et al. .......... | 206/718 |
| 4,707,657 A * | 11/1987 | Boegh-Petersen .......... | 324/537 |
| 4,752,027 A * | 6/1988 | Gschwend .............. | 228/180.22 |
| 4,915,744 A * | 4/1990 | Ho et al. ................ | 136/262 |
| 4,989,067 A * | 1/1991 | Noble et al. ............. | 257/735 |

(Continued)

OTHER PUBLICATIONS

NN77112474; IBM Technical Disclosure Bulletin, vol. No. 20, Issue No. 6, Page No. 2474-2479. Nov. 1, 1977.*

*Primary Examiner*—David E. Graybill
(74) *Attorney, Agent, or Firm*—John A. Jordan; William H. Steinberg

(57) ABSTRACT

A method of making an electronic package is described, wherein a substrate is provided with a pattern of conductive pads and a portion of solder positioned on selected ones of the pattern of copper pads. The solder is then reflowed to form partial hemispherically shaped caps on the selected copper pads. The partial hemispherically shaped caps are then coated with a solder flux. A thin semiconductor chip with a pattern of conductive elements, corresponding to partial hemispherically shaped capped pads, is then positioned on the substrate so that the conductive elements of the thin semiconductor chip substantially line up with the partial hemispherically shaped capped pads of the substrate. The solder is then heated to reflow temperature and an electrical couple is formed between the thin semiconductor chip and the substrate. Since all the solder necessary to make the electrical couple is positioned on the substrate, it is possible to use a thin semiconductor chip in the electronic package avoiding the problem presented by the handling and processing steps associated with securing a bumped wafer substrate during the thinning process and in subsequent processes of making the thinned semiconductor chip from the bumped wafer, for example, the dicing step.

5 Claims, 2 Drawing Sheets

U.S. PATENT DOCUMENTS

| | | | | |
|---|---|---|---|---|
| 5,104,689 A | | 4/1992 | Hayden et al. ............. | 427/123 |
| 5,218,030 A | * | 6/1993 | Katayose et al. ........... | 524/371 |
| 5,263,198 A | * | 11/1993 | Geddes et al. ............. | 455/325 |
| 5,352,745 A | * | 10/1994 | Katayose et al. ........... | 525/391 |
| 5,360,988 A | | 11/1994 | Uda et al. .................... | 257/529 |
| 5,384,955 A | * | 1/1995 | Booth et al. ................. | 29/830 |
| 5,394,609 A | | 3/1995 | Ferguson et al. ............ | 29/840 |
| 5,405,453 A | * | 4/1995 | Ho et al. ..................... | 136/249 |
| 5,432,681 A | * | 7/1995 | Linderman .................. | 361/790 |
| 5,434,452 A | * | 7/1995 | Higgins, III ................. | 257/773 |
| 5,476,566 A | * | 12/1995 | Cavasin ....................... | 156/249 |
| 5,491,303 A | * | 2/1996 | Weiss .......................... | 174/262 |
| 5,516,030 A | | 5/1996 | Denton ....................... | 228/180 |
| 5,519,658 A | * | 5/1996 | Uda et al. .................... | 365/200 |
| 5,539,153 A | | 7/1996 | Schwiebert et al. ........ | 174/260 |
| 5,586,715 A | | 12/1996 | Schwiebert et al. ........ | 228/248 |
| 5,587,342 A | * | 12/1996 | Lin et al. ..................... | 438/125 |
| 5,611,140 A | | 3/1997 | Kulesza et al. ............... | 29/832 |
| 5,672,542 A | | 9/1997 | Schwiebert et al. ........ | 437/183 |
| 5,699,613 A | * | 12/1997 | Chong et al. ................. | 29/840 |
| 5,719,437 A | * | 2/1998 | Clifton et al. ................ | 257/679 |
| 5,737,192 A | * | 4/1998 | Linderman .................. | 361/790 |
| 5,851,845 A | * | 12/1998 | Wood et al. .................. | 438/15 |
| 5,879,761 A | | 3/1999 | Kulesza et al. ............. | 427/555 |
| 5,880,017 A | | 3/1999 | Schwiebert et al. ........ | 438/613 |
| 5,918,364 A | | 7/1999 | Kulesza et al. ............... | 29/832 |
| 5,953,816 A | * | 9/1999 | Pai et al. ...................... | 29/852 |
| 5,986,340 A | | 11/1999 | Mostafazadeh et al. ..... | 257/713 |
| 6,033,764 A | | 3/2000 | Balents et al. ............. | 438/613 |
| 6,048,752 A | * | 4/2000 | Linderman .................. | 438/109 |
| 6,069,366 A | | 5/2000 | Goruganthu et al. ........ | 250/559 |
| 6,096,650 A | * | 8/2000 | Robinson et al. ........... | 438/689 |
| 6,138,348 A | | 10/2000 | Kulesza et al. ............... | 29/840 |
| 6,162,703 A | * | 12/2000 | Muntifering et al. ....... | 438/465 |
| 6,242,931 B1 | | 6/2001 | Hembree et al. ........... | 324/754 |
| 6,251,705 B1 | * | 6/2001 | Degani et al. ............. | 438/108 |
| 6,285,036 B1 | | 9/2001 | Goruganthu et al. ........ | 250/559 |
| 6,300,782 B1 | | 10/2001 | Hembree et al. ........... | 324/760 |
| 6,328,553 B1 | | 12/2001 | Joyner et al. ................ | 425/190 |
| 6,333,253 B1 | * | 12/2001 | Brownfield et al. ........ | 438/612 |
| 6,352,782 B2 | * | 3/2002 | Yeager et al. ................ | 428/461 |
| 6,369,448 B1 | * | 4/2002 | McCormick ................ | 257/777 |
| 6,369,451 B2 | * | 4/2002 | Lin .............................. | 257/779 |
| 6,403,449 B1 | * | 6/2002 | Ball ............................. | 438/460 |
| 6,441,312 B1 | | 8/2002 | Tanimura et al. ........... | 174/252 |
| 6,475,071 B1 | * | 11/2002 | Joslyn .......................... | 451/60 |
| 6,490,170 B2 | * | 12/2002 | Asai et al. ................... | 361/794 |
| 6,506,681 B2 | * | 1/2003 | Grigg et al. ................. | 438/692 |
| 6,507,118 B1 | * | 1/2003 | Schueller .................... | 257/778 |
| 6,518,885 B1 | * | 2/2003 | Brady et al. ............. | 340/572.7 |
| 6,558,978 B1 | * | 5/2003 | McCormick ................ | 438/108 |
| 6,621,147 B2 | * | 9/2003 | Ball ............................. | 257/622 |
| 6,638,389 B2 | * | 10/2003 | Kassir et al. ................ | 156/286 |
| 6,639,321 B1 | * | 10/2003 | Nagarajan et al. .......... | 257/778 |
| 6,674,157 B2 | * | 1/2004 | Lang ........................... | 257/678 |
| 6,713,366 B2 | * | 3/2004 | Mong et al. ................. | 438/459 |
| 6,798,044 B2 | * | 9/2004 | Joshi ........................... | 257/666 |
| 2001/0017414 A1 | * | 8/2001 | Gilleo ......................... | 257/737 |
| 2002/0031868 A1 | * | 3/2002 | Capote et al. .............. | 438/126 |
| 2002/0066950 A1 | * | 6/2002 | Joshi ........................... | 257/685 |
| 2002/0068453 A1 | * | 6/2002 | Grigg et al. ................. | 438/690 |
| 2002/0086625 A1 | * | 7/2002 | Vepa et al. ................... | 451/65 |
| 2002/0151187 A1 | * | 10/2002 | Ball ............................. | 438/758 |
| 2002/0166625 A1 | * | 11/2002 | Ball et al. .................... | 156/247 |
| 2003/0008510 A1 | * | 1/2003 | Grigg et al. ................. | 438/692 |
| 2003/0045072 A1 | * | 3/2003 | Jiang ........................... | 438/459 |
| 2003/0079826 A1 | * | 5/2003 | Kassir et al. ................ | 156/230 |
| 2003/0079828 A1 | * | 5/2003 | Kassir et al. ................ | 156/230 |
| 2003/0085464 A1 | * | 5/2003 | Lang ........................... | 257/728 |
| 2003/0190131 A1 | * | 10/2003 | Barth .......................... | 385/129 |
| 2003/0235937 A1 | * | 12/2003 | Mong et al. ................. | 438/106 |
| 2004/0048445 A1 | * | 3/2004 | Chason et al. .............. | 438/430 |
| 2004/0152285 A1 | * | 8/2004 | Konnemann ................ | 438/460 |

* cited by examiner

METHOD OF MAKING AN ELECTRONIC PACKAGE

FIELD OF THE INVENTION

This invention relates to a method of making an electronic package, and more particularly to a method of making a flip-chip package where the thickness of a semiconductor chip is reduced by backside grinding or polishing and assembled to a substrate having solder ball or bump connections thereon for electrical interconnection to the thinned semiconductor chip.

BACKGROUND OF THE INVENTION

The microelectronics industry has consistently achieved ever shrinking device sizes and ever greater levels of device integration, resulting in higher interconnect densities. A steady succession of interconnect developments and strategies has evolved in the packaging industry to meet the demand of these high interconnect densities. Nearly all have been aimed at one goal, that is, reduced size. Reduced size almost always translates into lower cost. Thus in state of the art packaging, dual-in-line packages have been largely replaced by surface mount packages to meet the high density interconnect demand. These and similar developments are directed toward reducing the package area, i.e. the x-y dimension of the package. Furthermore, in many applications, especially those requiring larger semiconductor chips, there has been a need to utilize thin semiconductor chips. These issues have been addressed by techniques for thinning the wafers from which chips are singulated. The thinning operation is performed on fully processed wafers by mounting the wafer, active side down, on a temporary carrier such as an adhesive tape and then grinding or polishing the backside of the wafer. A variety of techniques have been proposed and used, ranging from simple mechanical abrasion using, e.g., an abrasive grinding wheel, to chemical etching and polishing techniques, and combinations of these, e.g. chemical-mechanical polishing.

In a typical wafer thinning process, a 200 millimeter (mm) diameter wafer of completed integrated circuits (ICs) may be reduced from an initial thickness of about 26 to about 30 thousandths of an inch (mils) to a final thickness of only about 10-12 mils before it is remounted and diced into IC chips or die. The individual IC chips or die are then packaged, which may involve assembly into an single chip module (SCM) or multi-chip module (MCM). The term module as used herein refers to a sub-assembly of at least two components, a substrate, and at least one active chip which is flip chip bonded to the substrate.

Solder bump or solder ball interconnections are typically formed on a wafer from which flip chips are formed before thinning and dicing is performed. Thinning a solder bumped wafer presents many handling issues associated with securing the bumped wafer during the thinning process. In the subsequent process of making thinned flip chips, many process and handling steps, for example the dicing step, are performed on the bumped thinned wafer. To withstand the thinning process itself and subsequent process and handling without damage or fracture, wafer thinning can be performed to a thickness of about 10 mils or greater. A final flip chip thickness of less than about 10 mils, which would otherwise be desirable for many applications, is prohibited by the bumped wafer thinning process itself and exposure to the subsequent process and handling steps. This limitation, about 10 mils or greater, is generally accepted in the industry as a norm. This constraint rules out the use of thin flip chips (flip chips having a thickness of less than about 10 mils) in several important applications.

A technique for assembling a flip chip to a substrate to make an electronic package without the solder bumps or solder balls interconnections being a part of the flip chip, would enable flip chips to be used that are thinned to less than about 10 mils thick, and would be a substantial advance in packaging technology.

OBJECTS AND SUMMARY OF THE INVENTION

Accordingly, it is the object of this invention to enhance the art of electronic packaging.

It is another object of the present invention to provide a method of making an electronic package in which a thin semiconductor chip can be assembled to a substrate wherein electrically conductive members coupling the semiconductor chip to the substrate are provided on the substrate.

It is yet another object of the present invention to provide such a method of making an electronic package which can be performed in a facile manner.

According to one aspect of the invention, there is provided a method of making an electronic package, the method comprising the steps of providing a substrate having a first surface, providing a pattern of conductive pads on the first surface, positioning an electrically conductive member on selected ones of the pattern of conductive pads, providing a thin semiconductor chip having a pattern of conductive elements thereon substantially similar to the pattern of conductive pads on the first surface of the substrate, positioning the thin semiconductor chip on the substrate such that selected ones of the conductive elements are located on respective ones of the electrically conductive members, and heating the electrically conductive member to provide an electrical couple between the thin semiconductor chip and the substrate.

BEST MODE FOR CARRYING OUT THE INVENTION

Figure 1:
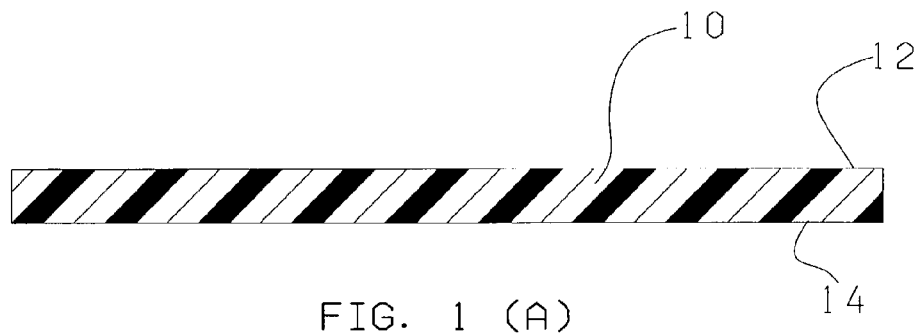
FIGS. 1(A) to 1(H) are diagrams showing a method of making an electronic package according to one embodiment of the present invention.
Figure 1:
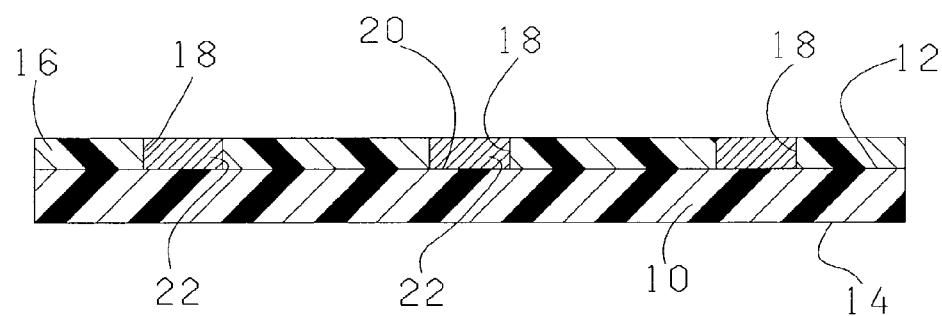
Figure 1:
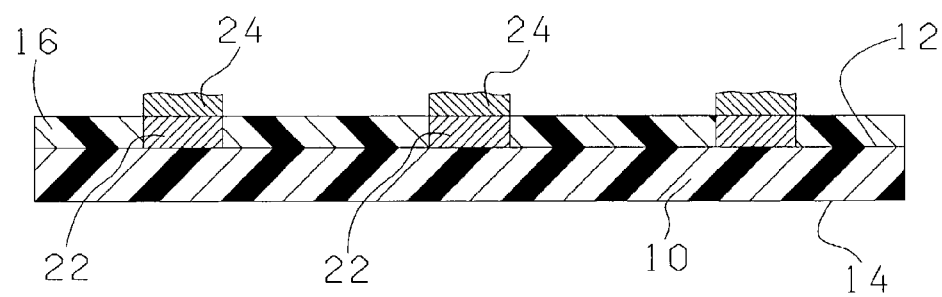
Figure 1:
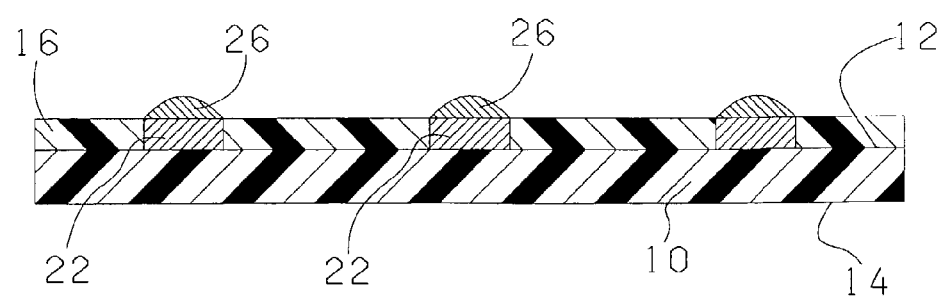
Figure 1:
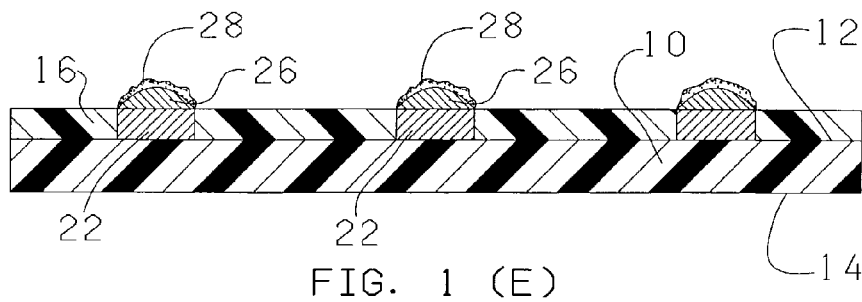
Figure 1:
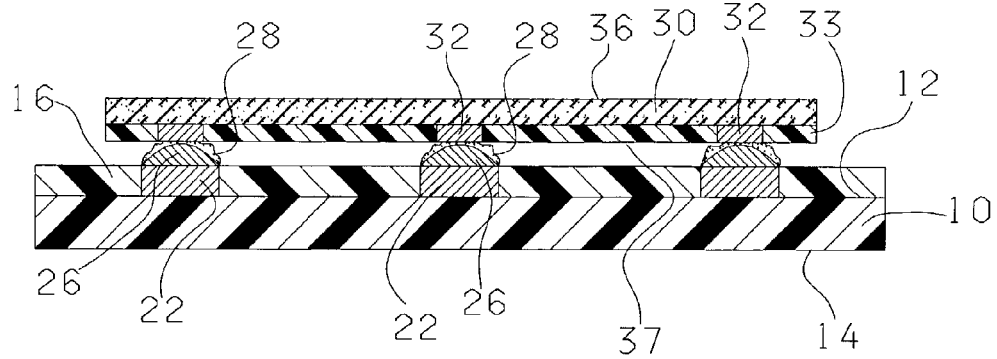
Figure 1:
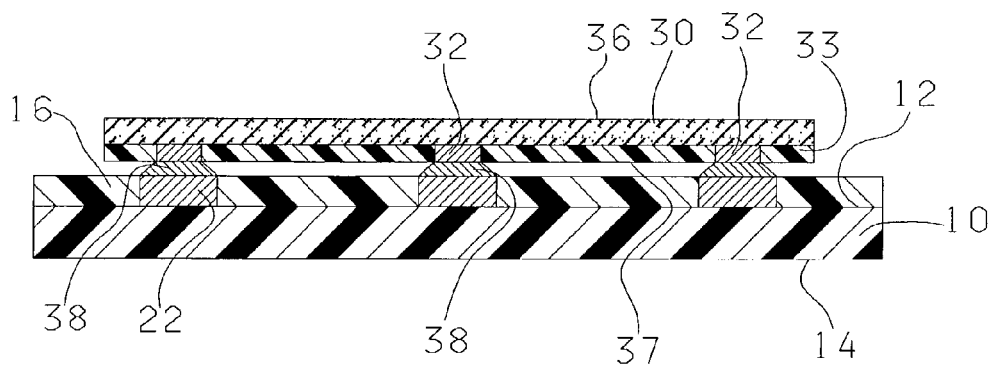
Figure 1:
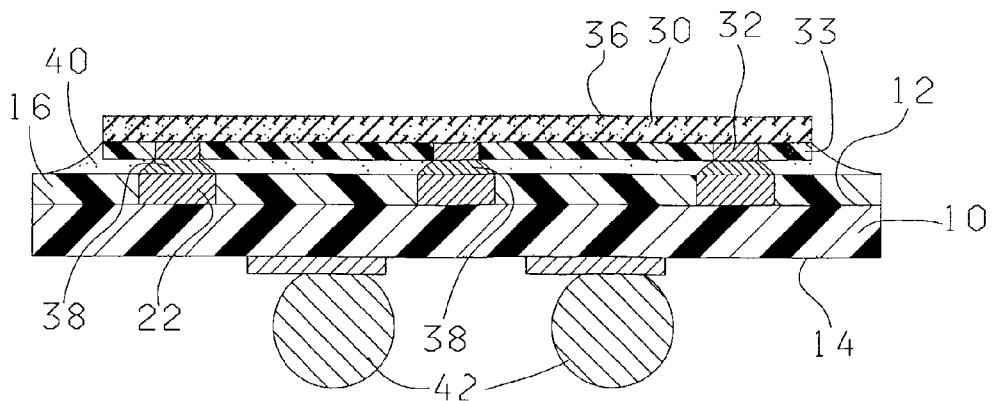

For a better understanding of the present invention, together with other and further objects, advantages and capabilities thereof, reference is made to the following disclosure and appended claims in connection with the above-described drawings.

According to a method of the present invention, a substrate is provided with a pattern of copper pads. A portion of solder is positioned on selected ones of the pattern of copper pads. The solder is then reflowed to form partial hemispherically shaped caps on the selected copper pads. The partial hemispherically shaped caps are then coated with a solder flux. A thinned semiconductor chip with a pattern of pads having Underlying Bump Metallurgy (UBM) thereon, corresponding to partial hemispherically shaped capped pads, is then positioned on the substrate so that the pads of the thin semiconductor chip substantially line up with the partial hemispherically shaped capped pads of the substrate. UBM that can be used in this invention includes, for example, chrome-copper-gold. The solder is then heated to reflow temperature and an electrical couple is formed between the thin semiconductor chip and the substrate. Since all the solder necessary to make the electrical couple is positioned on the substrate, it is not necessary to thin or handle a wafer having solder bumps thereon, avoiding the steps associated with securing the solder bumped wafer during the thinning process and with subsequent handling steps. These steps typically can result in substantial damage to the wafer and thin semiconductor chip formed therefrom, due to chipping or cracking of the silicon rendering it useless and affecting manufacturing yields and cost. Furthermore small cracks may not become apparent until the thin semiconductor chip is stressed during operation under field conditions, affecting electronic package reliability. Using the process of the present invention, it is possible to thin an unbumped wafer to minimum thicknesses not previously economically practical. The chipping and cracking problems associated with thinning and handling a solder bumped wafer are substantially prevented. Thin semiconductor chips in an electronic package are very advantageous for at least two reasons. One advantage is that of an overall lower package profile height, which saves valuable packaging real estate. Another advantage is that thin semiconductor chips are inherently more flexible and can better withstand package bending (without cracking) that can occur during thermal cycling associated with testing and operational field use due to coefficient of thermal expansion (CTE) and elastic modulus mismatches between a semiconductor chip and substrate. Thus thin semiconductor chips that yield lower manufacturing costs and improved reliability are realized for the electronic package.

An embodiment of the present invention will now be described referring to FIGS. 1(A) to 1(H). Each step shown in FIGS. 1(A) to 1(H) will be explained in order.

First, in step 1(A), a substrate 10 having a first surface 12 is provided. The substrate 10 can be comprised of a dielectric material, for example, a composite circuit substrate comprising laminated glass-epoxy sheets, ceramic, polytetrafluoroethylene, a liquid crystal polymer or any material adaptable to carrying a semiconductor chip. Substrate 10 can include thermal compensating layers, wiring layers, or power/ground layers (not shown). It can also include conductive through holes or vias (not shown) for interconnecting various internal layers to external conductors. Substrate 10 includes a second surface 14.

In step 1(B), a dielectric layer 16 is provided on first surface 12 of substrate 10. The dielectric layer can be comprised of suitable organic polymeric material. One dielectric material that can be used is a polyimide material. Another polymeric material that can be used is a material including the resin comprising an modified polyphenylene ether (MPPE). Useful MPPE resins which may be used in conjunction with the present invention are disclosed in U.S. Pat. No. 5,352,745 (Katayose et al. issued on Oct. 4, 1994) ("Katayose '745"), assigned to Asahi Kasei Kogyo Kabushiki Kaisha of Tokyo, Japan, and incorporated herein by reference in its entirety. The MPPE resin is described in the Katayose '745 patent as a curable polyphenylene ether resin composition comprising a reaction product obtained by reacting a polyphenylene ether with an unsaturated carboxylic acid or an acid anhydride and at least one cyanurate. Useful MPPE resins which may be used in conjunction with the present invention are disclosed in U.S. Pat. No. 5,218,030 (Katayose et al. issued Jun. 8, 1993) ("Katayose '030"), assigned to Asahi Kasei Kogyo Kabushiki Kaisha of Tokyo, Japan, and incorporated herein by reference in its entirety. In relation to other MPPE resins, the Katayose '030 patent describes the use of poly(phenylene ether) containing pendant allyl or propargyl groups, triallylcyanurate or triallylisocyanurate, and optionally an antimony-containing flame retardant; other formulations replace the antimony flame retardant with bromine containing compounds. Useful MPPE resins which may be used in conjunction with the present invention are disclosed in U.S. Pat. No. 6,352,782 B2 (Yeager et al. issued Mar. 5, 2002) ("Yeager '782"), assigned to General Electric Company, and incorporated herein by reference in its entirety. The modified PPE resin as describe in the Yeager '782 patent is a reactively end capped poly(phenylene ether) compound cured with certain unsaturated compounds. The MPPE material may be utilized in the form of the MPPE resin coated onto a metal foil, for example a copper foil. A commercially available MPPE that is suitable for the present invention is manufactured by the Asahi Chemical Company of Japan and is identified as Asahi product number PC5103, which comprises the resin coated onto a copper foil. Other examples of dielectric materials that can be used in this invention are PSR 4000 AUS 703 available from Taiyo Corporation, 2675 Antler Drive, Carson City, Nev., 89701 and DSR 2200 FX-7A available from Tamura Corporation, 3-27-27 Tarune-Cho, Suita Shi, Ahsaka 564, Japan.

Dielectric layer 16 can be patterned by photoprocessing or laser processing resulting in sidewalls 18 and bottom walls 20 being formed in the dielectric layer defining a plurality of apertures in the dielectric layer of substrate 10, which can be substantially filled with a conductive material to form a pattern of conductive pads 22. The pattern of conductive pads 22 can be comprised of a suitable metal such as, copper, gold, tin and nickel or alloys thereof. Conductive pads 22 can also be coated with an organic surface protectant layer, such as benzatriaziole. In this embodiment, pattern of conductive pads 22 are provided by plating metal or screening a metal paste into the apertures in dielectric layer 16. The pattern of conductive pads 22 can also by formed by a photo and etch process, known in the art and not described herein.

In step 1(C), a layer of electrically conductive material 24 is positioned on each conductive pad 22. The layer of electrically conductive material 24 can be applied by a process of screening a solder paste or plating a solder onto each conductive pad 22. Other materials, such as electrically conductive polymers can also be screened onto each conductive pad 22. One solder that can be used in this invention includes a tin-lead eutectic solder having a composition of about 63 wt. % tin and about 37 wt. % lead. Lead-free solders can also be used. Some examples of lead-free solder alloys that can be used in this invention are tin and copper, tin and silver, or tin, silver, and copper alloys. An example of a tin/silver/copper alloy that can be used in this invention comprises about 90 wt. % tin, about 4.0 wt. % or less silver and about 1.5 wt. % or less copper. Electrically conductive polymers that can be used in this invention include silver filled epoxies, some examples of which include Epoxy Technology Epotek 2101, a product available from Epoxy Technology, 14 Fortune Drive, Billerica, Mass. 01821, Ablestik Ablebond 8175, a product available from Ablestik Laboratories, 29921 Susanna Road, Rancho Dominguez, Calif. 90221, and EMS DA 5915, a product available from Engineered Materials Systems Inc., 132 Johnson Drive, Delaware, Ohio 43015.

In step 1(D), the layer of electrically conductive material 24 of step 1(C) is reflowed to form electrically conductive members 26, each having a partial hemispherical shape. Reflow temperature, reflow time, and dwell times will depend on the type of solder used, the size of the electronic package, and the type of reflow equipment used to perform the reflow. In one example, a water soluble solder paste having an alloy composition corresponding to eutectic tin-lead solder (electrically conductive material 24) was deposited on a pad positioned on a substrate, similar to conductive pad 22. The paste was then reflowed to form a hemispherical bump, an electrically conductive member similar to electrically conductive member 26 as shown in FIG. 1(D), on the pad. Finally, the solder bumped substrate was cleaned using deionized water to remove the water soluble flux residue. If an electrically conductive polymer is used to form electrically conductive members 26, no reflow step is required and the electrically conductive member would take an "as screened" shape.

In step 1(E) a portion of solder flux is applied to yield a substantially continuous solder flux layer 28 on each electrically conductive member 26. Solder flux layer 28 can be applied by screening, spraying or dipping. Solder fluxes, that can used in this invention are, for example, low residue no clean fluxes or water soluble fluxes. One example of a low residue no clean flux, commercially available from Alpha Metals, Inc., 580-A Tollgate Road, Elgin, Ill., 60123, is Alpha 376. One example of a water soluble flux also commercially available from Alpha Metals, Inc. is Alpha WS 600. In this embodiment, solder flux layer 28 can serve as an adhesive for subsequent positioning of the conductive pads of a thin semiconductor and as a cleaning agent or oxide removal agent in a subsequent reflow step to be used to form an electrical couple, described hereinbelow. If electrically conductive members 26 are comprised of an electrically conductive polymer or another non-metal material, solder flux would not be utilized.

In step 1(F) a thin semiconductor chip 30 having a pattern of conductive elements 32 thereon, similar to the pattern of conductive pads 22, is positioned on substrate 10 such that selected ones of the conductive elements are located on respective ones of electrically conductive members 26 coated with solder flux layer 28. Semiconductor chip 30 includes a layer of dielectric material 33 positioned between pattern of conductive elements 32. Dielectric material 33 can be a polyimide or silica nitride. Conductive elements 32 can include UBM, as described above. Thin semiconductor chip 30 includes a surface 36 that has been ground or polished at the wafer level by mechanical, chemical, or chemical-mechanical means to thin what was the original chip to a thickness of less than about 8 mils. Thinning can be performed at the wafer level before assembly of the chip to substrate 10. When chemical-mechanical polishing is utilized to accomplish thinning, an abrasive slurry is applied to the original surface of the semiconductor chip, opposite surface 37, and this surface is polished with a grinding wheel to yield surface 36. An example of an abrasive slurry that can be used with this invention is a silicon dioxide (silica) slurry having particles with a size of from about 10 nanometers to about 300 nanometers. During polishing, the wafer is held in place at surface 37 by a vacuum chuck to prevent damage to dielectric material 33 or conductive elements 32.

In step 1(G) electrically conductive members 26 of step 1(F) are heated to form electrical couples 38 between thin semiconductor chip 30 and substrate 10. Heating electrically conductive members 26 comprises reflowing partial hemispherically shaped capped pads 26 at the melting temperature of the solder. Residual solder flux (solder flux components that did not volatilize at the reflow temperature) is then cleaned with water and a saponifier to remove the residues. If electrically conductive members are comprised of an electrically conductive polymer material, the heating step comprises substantially curing the polymer material to form the electrical couple.

In step 1(H) an underfill or encapsulant material 40 is positioned on electrical couples 38 between thin semiconductor chip 30 and substrate 10. The encapsulant material can be a high modulus resin material filled with a silica material adjusted to match the CTE of the electrically conductive material being utilized. Examples of commercially available encapsulants that can be used in this invention are Hysol FP 4549 and Loctite™ 3593 both made by Loctite Corporation, Loctite North America, 1001 Trout Brook Crossing, Rocky Hill, Conn. 06067 and Namics U8437 made by Namics Corporation, 3993 Nigorikawa, Niigata City, 950-3131, Japan. A plurality of solder ball connections 42 are provided on second surface 14 of substrate 10, selected ones of which are electrically connected by conductive through connections in the substrate (not shown) to selected ones of the plurality of conductive pads 22 on first surface 12 of the substrate.

While one embodiment of the present invention has thus been described with reference to the drawings, it should be understood that the invention is not limited to the embodiment exemplified or illustrated in the drawings. In this manner, various modifications, alterations and changes may be made to this embodiment on the basis of knowledge of those skilled in the art without departing from the scope of the present invention.

We claim:

1. A method of making an electronic package, said method comprising the steps of:

providing a substrate having a first surface;

providing said first surface with a layer of modified polyphenyline ether dielectric material;

forming a plurality of apertures in said modified polyphenylene ether dielectric material;

at least partially filling said apertures with a conductive material to form a pattern of conductive pads;

positioning solder on selected ones of said pattern of conductive pads for attachment to a chip;

heating to reflow said solder after positioning said solder to form a solder bump on said selected ones of said pattern of conductive pads;

positioning a portion of solder flux material on each said solder bump to form a plurality of solder bumps with flux;

providing a semiconductor chip having a first and second surface;

thinning said semiconductor chip by mechanical grinding, chemical polishing, or chemical-mechanical polishing said first surface to a polished first surface that provides a chip thickness of less than 8 mils;

forming a pattern of conductive elements on said second surface of said semiconductor chip substantially similar to said pattern of conductive pads on said first surface of said substrate;

positioning on said substrate the said semiconductor chip so that said polished first surface that provides a chip having a thickness of less than 8 mils is facing upwardly and is exposed and so that selected ones of said conductive elements on said second surface of said chip are located on respective ones of said plurality of solder bumps with flux;

heating said substrate with chip positioned thereon and said polished surface exposed a second time to reflow each of said solder bumps of said plurality of solder bumps with flux to provide an electrical couple between said semiconductor chip and said substrate; and positioning an encapsulant material on said electrical couple between said semiconductor chip and said substrate.

2. The method of making the electronic package of claim 1, further including the step of providing said substrate with a second surface having a plurality of solder ball connections thereon, selected ones of said plurality of solder ball connections being electrically connected to said selected ones of said pattern of conductive pads on said first surface of said substrate.

3. The method of making the electronic package of claim 1, wherein said semiconductor chip is thinned in said thinning step by chemical-mechanical polishing said semiconductor chip with a silicon dioxide slurry having particles with a size of from about 10 nanometers to about 300 nanometers.

4. A method of making an electronic package, said method comprising the steps of:

providing a substrate having a first surface;

providing said first surface with a layer of modified polyphenyline ether dielectric material;

forming a plurality of apertures in said modified polyphenylene ether dielectric material;

at least partially filling said apertures with a conductive material to form a pattern of conductive pads;

positioning solder on selected ones of said pattern of conductive pads for attachment to a chip;

heating to reflow said solder after positioning said solder to form a solder bump on said selected ones of said pattern of conductive pads;

positioning a portion of solder flux material on each said solder bump to form a plurality of solder bumps with flux;

providing a semiconductor chip having an active side and non-active side;

thinning said semiconductor chip by chemical-mechanical polishing with a silicon dioxide slurry having particle sizes from about 10 nanometers to 300 nanometers the said non-active side of said chip to a polished non-active side surface that provides a chip thickness of less than 8 mils;

forming a pattern of conductive elements on the said active side of said semiconductor chip substantially similar to said pattern of conductive pads on said first surface of said substrate;

positioning on said substrate the said semiconductor chip so that said polished non-active side surface that provides a chip thickness of less than 8 mils is facing upwardly and is exposed and so that selected ones of said conductive elements on said active side of said chip are located on respective ones of said plurality of solder bumps with flux;

heating said substrate with chip positioned thereon and said polished surface exposed a second time to reflow each of said solder bumps of said plurality of solder bumps with flux to provide an electrical couple between said semiconductor chip and said substrate; and positioning an encapsulant material on said electrical couple between said semiconductor chip and said substrate.

5. The method of making the electronic package of claim 4, further including the step of providing said substrate with a second surface having a plurality of solder ball connections thereon, selected ones of said plurality of solder ball connections being electrically connected to said selected ones of said pattern of conductive pads on said first surface of said substrate.

* * * * *